(12) United States Patent
Kim et al.

(10) Patent No.: US 12,123,925 B2
(45) Date of Patent: Oct. 22, 2024

(54) FAN FAULT DETECTION DEVICE

(71) Applicant: SAMSUNG SDI CO., LTD., Yongin-si (KR)

(72) Inventors: Suk Ki Kim, Yongin-si (KR); Hyungho Kim, Yongin-si (KR); Jeonghyup Ko, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 18/224,016

(22) Filed: Jul. 19, 2023

(65) Prior Publication Data

US 2023/0358823 A1 Nov. 9, 2023

Related U.S. Application Data

(62) Division of application No. 17/097,532, filed on Nov. 13, 2020, now Pat. No. 11,789,091.

(30) Foreign Application Priority Data

Nov. 15, 2019 (KR) .......................... 10-2019-0147178

(51) Int. Cl.
*G01R 31/56* (2020.01)
*F04D 25/06* (2006.01)
(Continued)

(52) U.S. Cl.
CPC .......... *G01R 31/56* (2020.01); *F04D 25/0673* (2013.01); *F04D 27/008* (2013.01);
(Continued)

(58) Field of Classification Search
None
See application file for complete search history.

(56) References Cited

U.S. PATENT DOCUMENTS

| 11,632,060 B2 * | 4/2023 | Hario | H02M 7/4835 |
| | | | 363/65 |
| 11,789,091 B2 * | 10/2023 | Kim | H01M 10/4285 |
| | | | 324/511 |
| 2008/0165020 A1 * | 7/2008 | Chen | G06F 11/0772 |
| | | | 340/648 |

(Continued)

FOREIGN PATENT DOCUMENTS

| CN | 116857216 A | * 10/2023 | ............. F04D 25/08 |
| EP | 1983603 | 10/2008 | |

(Continued)

OTHER PUBLICATIONS

English translation of JP 2016008734 A (Year: 2016).*
(Continued)

*Primary Examiner* — Jermele M Hollington
(74) *Attorney, Agent, or Firm* — Lewis Roca Rothgerber Christie LLP

(57) ABSTRACT

A fan fault detection device includes: a plurality of sub-modules; and a master module to configured to determine faults of a plurality of fans, wherein each of the plurality of sub-modules includes: a first input terminal for receiving a detection signal indicating whether a corresponding fan is defective; a second input terminal; an output terminal; a switching circuit connected between the output terminal and a first power source for supplying a voltage signal corresponding to a state signal and, the switching circuit configured to switch an output of the state signal through the output terminal according to the detection signal; and a first signal transmission circuit connected between the first input terminal and the switching circuit, the first signal transmission circuit configured to transmit the detection signal to the switching circuit according to a signal received by the second input terminal.

13 Claims, 7 Drawing Sheets

(51) Int. Cl.
  *F04D 27/00* (2006.01)
  *H01M 10/42* (2006.01)
  *H01M 10/613* (2014.01)
  *H01M 10/6563* (2014.01)

(52) U.S. Cl.
  CPC ..... *H01M 10/425* (2013.01); *H01M 10/4285* (2013.01); *H01M 10/613* (2015.04); *H01M 10/6563* (2015.04); *H01M 2010/4271* (2013.01)

(56) References Cited

U.S. PATENT DOCUMENTS

| | | |
|---|---|---|
| 2009/0024252 A1 | 1/2009 | Koji et al. |
| 2010/0291414 A1 | 11/2010 | Bell et al. |
| 2013/0033213 A1* | 2/2013 | Wang ............... F04D 27/004 318/472 |
| 2014/0247038 A1* | 9/2014 | Wu ................... G01P 3/489 324/166 |
| 2014/0300364 A1 | 10/2014 | Choi |
| 2015/0160077 A1 | 6/2015 | Min et al. |
| 2016/0226301 A1 | 8/2016 | Lee et al. |
| 2021/0148995 A1* | 5/2021 | Kim ............... H01M 10/6563 |

FOREIGN PATENT DOCUMENTS

| | | | | |
|---|---|---|---|---|
| EP | 3822714 A1 | * | 5/2021 | ......... F04D 25/0673 |
| JP | 2007-157403 | | 6/2007 | |
| JP | 2009-112074 | | 5/2009 | |
| JP | 2014-161178 | | 9/2014 | |
| JP | 2016008734 A | * | 1/2016 | |
| JP | 2016-144355 | | 8/2016 | |
| KR | 10-2012-0088219 | | 8/2012 | |
| KR | 10-2014-0121186 | | 10/2014 | |
| KR | 10-2018-0003891 | | 1/2018 | |

OTHER PUBLICATIONS

English translation of CN-116857216-A (Year: 2023).*
Extended European Search Report dated Apr. 21, 2021 issued to European Patent Application No. 20207656.8.
Notice of Allowance issued in Korean Patent Application No. 10-2019-0147178 on May 28, 2021.
Non-Final Office Action dated Dec. 5, 2022, issued to U.S. Appl. No. 17/097,532.
Notice of Allowance dated Jun. 14, 2023, issued to U.S. Appl. No. 17/097,532.

* cited by examiner

FAN FAULT DETECTION DEVICE

CROSS REFERENCE TO RELATED APPLICATIONS

This application is a Divisional of U.S. patent application Ser. No. 17/097,532, filed on Nov. 13, 2020, which claims priority from and the benefit of Korean Patent Application No. 10-2019-0147178, filed on Nov. 15, 2019, both of which are hereby incorporated by reference for all purposes as if fully set forth herein.

BACKGROUND

Field

Illustrative embodiments of the invention relate generally to a fan fault detection device and more specifically, to a fan fault detection device for a battery system.

Discussion of the Background

Cooling in a battery system is a very important problem that may affect safety of the battery system as well as a cycle-life thereof. Therefore, the battery system is equipped with various cooling devices. In a case of a high voltage battery system, a cooling fan may be used as a cooling device.

A fault of the fan installed in the battery system is usually detected and repaired by a battery management system (BMS) of the battery system. In the high voltage battery system, a low voltage power source is used in a circuit that supplies power to the fan and detects a fault of the fan to transmit the detected signal to the BMS. For safety, the circuit that detects the fault of the fan must be separated by an insulation distance from a high voltage side, and the insulation distance is determined according to a voltage level of a power source of the high voltage side, e.g., a battery module. In this case, an operating voltage of an element used for insulation is also determined according to the voltage level of the battery module.

In a case of a high voltage battery system with a voltage output of 1.5 kV or higher, the supply and demand of an element for insulation between a circuit that detects a fault of a fan and a high voltage side may be a problem. Typically, there are hardly any insulating elements operating at a voltage level of 1.5 kV or higher, and even if they exist, since they are very expensive, and there is a difficulty in supplying parts, resulting in a problem of increasing a cost of the battery system.

The above information disclosed in this Background section is only for understanding of the background of the inventive concepts, and, therefore, it may contain information that does not constitute prior art.

SUMMARY

Applicant realized a problem of increased costs of a high voltage battery system due to demand for an element for insulation between a circuit for detecting a fault of fans for cooling the high voltage battery system and the high voltage side of the high voltage battery system.

Fan fault detection devices for a battery system constructed according to the principles and illustrative implementations of the invention are capable of reducing cost of a battery system while securing an insulation distance from the high voltage side and reducing the installation space for the circuit for detecting the fault of the fans for cooling the high voltage battery system.

Fan fault detection devices for a battery system constructed according to the principles and illustrative implementations of the invention operate completely separated from a battery module, which is a high voltage side of a battery system. Thus, parts used for signal transmission are easily selected and supplied, and a manufacturing cost thereof may be low.

Additional features of the inventive concepts will be set forth in the description which follows, and in part will be apparent from the description, or may be learned by practice of the inventive concepts.

According to one or more illustrative embodiments of the invention, a fan fault detection device of a battery system includes: a plurality of sub-modules; and a master module to configured to determine faults of a plurality of fans, wherein each of the plurality of sub-modules includes: a first input terminal for receiving a detection signal indicating whether a corresponding fan is defective; a second input terminal; an output terminal; a switching circuit connected between the output terminal and a first power source for supplying a voltage signal corresponding to a state signal and, the switching circuit configured to switch an output of the state signal through the output terminal according to the detection signal; and a first signal transmission circuit connected between the first input terminal and the switching circuit, the first signal transmission circuit configured to transmit the detection signal to the switching circuit according to a signal received by the second input terminal, wherein: in a first sub-module of the plurality of sub-modules, a second input terminal thereof is connected to the first power source, and in a second sub-module of the plurality of sub-modules, an output terminal thereof is connected to the master module, and a second input terminal thereof is connected to an output terminal of the first sub-module.

The switching circuit may include: a switching element connected between the first power source and the output terminal of each of the plurality of sub-modules, the switching element including a control terminal connected to the first input terminal through the first signal transmission circuit; and a resistor connected between the first power source and the control terminal of the switching element.

The switching element of the switching circuit may be configured to be turned on when the detection signal indicates a normal state of the corresponding fan.

The switching element of the switching circuit may be a PNP transistor including an emitter connected to the first power source and a collector connected to the output terminal.

The first signal transmission circuit may include a photocoupler including: a light emitting element connected between the second input terminal and a first ground; and a light receiving element connected between the switching circuit and the first input terminal.

The master module may include: an input terminal connected to the output terminal of the second sub-module; a controller configured to determine whether at least one of the plurality of fans is defective; and a second signal transmission circuit configured to transmit a signal received through the input terminal of the master module in an insulated state to an input terminal of the controller.

The second signal transmission circuit may include a resistor and a photocoupler connected between a second power source and the input terminal of the controller, and the photocoupler may include: a light emitting element connected between the input terminal and a first ground; and a light receiving element connected between the input terminal of the controller and a second ground.

The first power source may be a power source for supplying an operating voltage to the plurality of fans.

The plurality of sub-modules may be mounted on each of a plurality of battery management systems mounted for each of a plurality of battery modules in a battery system.

According to one or more illustrative embodiments of the invention, a fan fault detection device of a battery system includes: a plurality of sub-modules; and a master module configured to determine faults of a plurality of fans, wherein each of the plurality of sub-modules includes: a first input terminal for receiving a detection signal indicating whether a corresponding fan is defective; a second input terminal receiving a state signal; an output terminal; a first signal transmission circuit connected between the second input terminal and the output terminal, the first signal transmission circuit configured to control transmission of the state signal between the second input terminal and the output terminal; and a switching circuit connected to the first input terminal, the switching circuit configured to switch the transmission of the state signal of the first signal transmission circuit according to the detection signal, wherein: in a first sub-module of the plurality of sub-modules, a second input terminal thereof is connected to a first ground, and in a second sub-module of the plurality of sub-modules, an output terminal thereof is connected to the master module, and a second input terminal thereof is connected to an output terminal of the first sub-module.

The switching circuit may include a switching element connected between a first power source and the first signal transmission circuit and including a control terminal connected to the first input terminal.

The switching element of the switching circuit may be configured to be turned on when the detection signal indicates a normal state of the corresponding fan.

The switching element of the switching circuit may be a PNP transistor including an emitter connected to the first power source and a collector connected to the first signal transmission circuit.

The first signal transmission circuit may include a photocoupler including: a light emitting element connected between the switching circuit and the first ground; and a light receiving element connected between the output terminal and the second input terminal, and the light emitting element configured to emit light when connected to the first power source by the switching circuit.

The master module may include: an input terminal connected to the output terminal of the second sub-module; a controller configured to determine whether at least one of the plurality of fans is defective; and a second signal transmission circuit configured to transmit a signal corresponding to a signal received through the input terminal of the master module in an insulated state to an input terminal of the controller.

The second signal transmission circuit may include a resistor and a photocoupler connected between a second power source and the input terminal of the controller, and the photocoupler may include: a light emitting element connected between the input terminal and a first power source; and a light receiving element connected between the input terminal of the controller and a second ground.

The master module may further include a filter circuit connected between the input terminal and the second signal transmission circuit, and the filter circuit may include: a switching element including a control terminal connected between a first power source and the second signal transmission circuit, the switching element configured to switch connection between the first power source and the second signal transmission circuit according to a signal received by the control terminal, and a resistor connected between the first power source and the control terminal.

The switching element of the filter circuit may be a PNP transistor including an emitter connected to the first power source and a collector connected to the second signal transmission circuit.

The second signal transmission circuit may include a resistor and a photocoupler connected between a second power source and the input terminal of the controller, and the photocoupler may include: a light emitting element connected between the first power source and the first ground through the switching element; and a light receiving element connected between the input terminal of the controller and the second ground.

According to one or more illustrative embodiments of the invention, a fan fault detection device of a battery system includes: a plurality of sub-modules; and a master module configured to determine faults of a plurality of fans, wherein each of the plurality of sub-modules may include: a first input terminal receiving a detection signal indicating whether a corresponding fan is defective; a second input terminal receiving a state signal; an output terminal; and a first signal transmission circuit connected between the first input terminal and a coupling node on a signal transmission line connecting the second input terminal and the output terminal to each other, the first signal transmission circuit configured to control transmission of the detection signal between the first input terminal and the coupling node according to the detection signal, wherein: in a first sub-module of the plurality of sub-modules, a second input terminal thereof is floating, and in a second sub-module of the plurality of sub-modules, an output terminal thereof is connected to the master module, and a second input terminal thereof is connected to an output terminal of the first sub-module.

The first signal transmission circuit may include: a resistor connected between the first input terminal and a first power source; and a diode including an anode connected to the first input terminal and a cathode connected to the coupling node.

The master module may include: an input terminal connected to the output terminal of the second sub-module; a controller configured to determine whether at least one of the plurality of fans is defective; and a second signal transmission circuit configured to transmit a signal received through the input terminal of the master module in an insulated state to an input terminal of the controller.

The second signal transmission circuit may include a resistor and a photocoupler connected between a second power source and the input terminal of the controller, and the photocoupler may include: a light emitting element connected between the input terminal and a first ground; and a light receiving element connected between the input terminal of the controller and a second ground.

The fan fault detection device according to illustrative embodiments operates completely separated from a battery module, which is a high voltage side, in a battery system. Therefore, parts used for signal transmission may be easily selected and supplied, and a manufacturing cost thereof may be low.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE EMBODIMENTS

Figure 1:
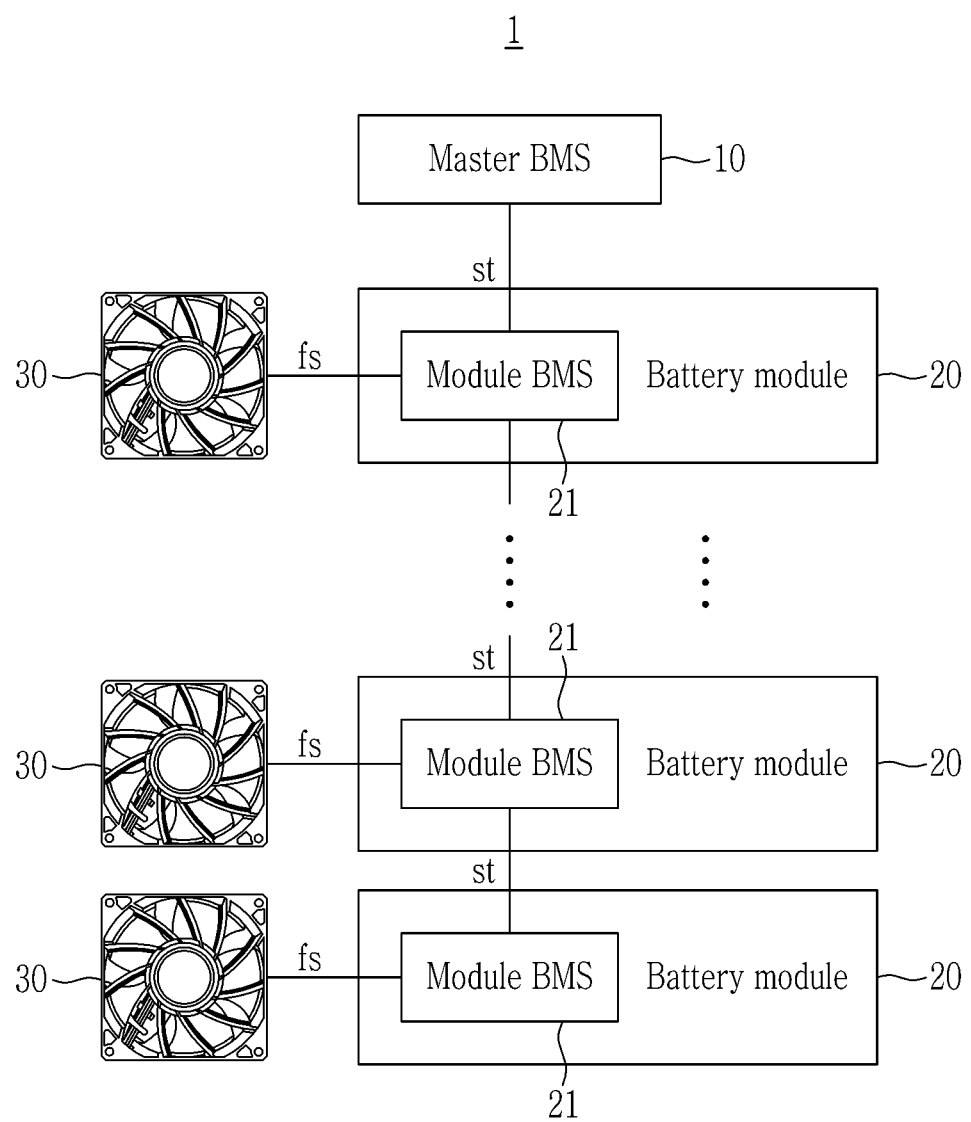
FIG. 1 is a schematic view of an illustrative embodiment of a battery system constructed according to the principles of the invention.

In the following description, for the purposes of explanation, numerous specific details are set forth in order to provide a thorough understanding of various illustrative embodiments or implementations of the invention. As used herein "embodiments" and "implementations" are interchangeable words that are non-limiting examples of devices or methods employing one or more of the inventive concepts disclosed herein. It is apparent, however, that various illustrative embodiments may be practiced without these specific details or with one or more equivalent arrangements. In other instances, well-known structures and devices are shown in block diagram form in order to avoid unnecessarily obscuring various illustrative embodiments. Further, various illustrative embodiments may be different, but do not have to be exclusive. For example, specific shapes, configurations, and characteristics of an illustrative embodiment may be used or implemented in another illustrative embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an illustrative embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As is customary in the field, some illustrative embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some illustrative embodiments may be physically separated into two or more interacting and discrete blocks, units, and/or modules without departing from the scope of the inventive concepts. Further, the blocks, units, and/or modules of some illustrative embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic view of an illustrative embodiment of a battery system constructed according to the principles of the invention.

Referring to FIG. 1, a battery system 1 according to an illustrative embodiment may include a master battery management system (BMS) 10, a plurality of battery modules 20, and a plurality of fans 30.

Each of the plurality of battery modules 20 includes a plurality of battery cells that are connected in series or in parallel to each other. Further, the plurality of battery modules may also be connected in series or in parallel to each other.

Each battery module 20 may include a module BMS 21. The module BMS 21 may measure a voltage, a current, a temperature, a pressure, etc. of each battery module 20. Further, the module BMS 21 may perform at least one control function.

Each of the plurality of cooling fans 30 may be disposed adjacent to each of the plurality of battery modules 20 or mounted on each of the plurality of battery modules 20 to perform a cooling function of each of the plurality of battery modules 20.

Figure 2:
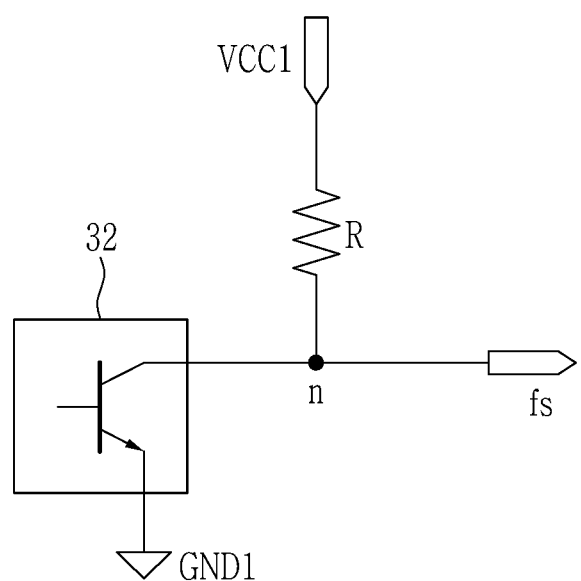
FIG. 2 is a schematic view of a fault detection circuit of the battery system of FIG. 1.

Each fan 30 may include a fault detection circuit that detects a fault or defect of the fan 30. FIG. 2 is a schematic view of a fault detection circuit of the battery system of FIG. 1, and FIG. 3 is a drawing for explaining an operation method of the fault detection circuit of FIG. 2.

Referring to FIG. 2, a fault detection circuit 31 for detecting the fault or defect of the fan 30 includes an open collector type of switching element 32 connected between a ground GND1 and an output node n, and a resistor R connected between a power source VCC1 and the output node n, and it may output a detection signal fs indicating whether the fan 30 has failed or is defective.

Figure 3:
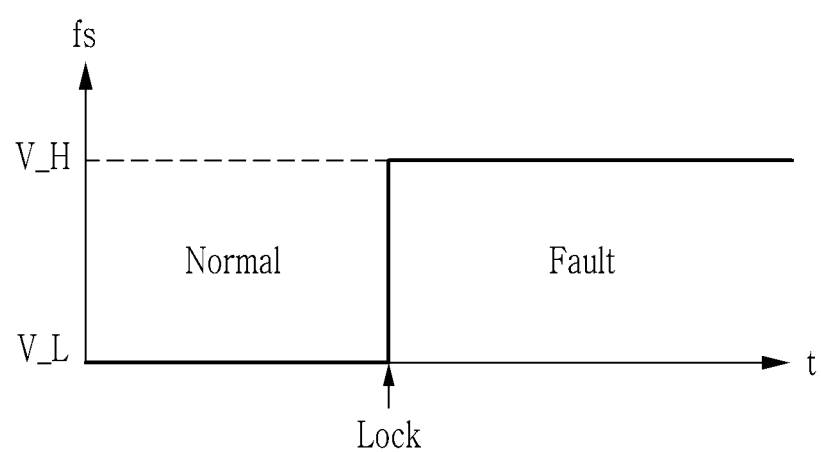
FIG. 3 is a drawing for explaining an operation method of the fault detection circuit of FIG. 2.

Referring to FIG. 3, in the fault detection circuit 31, while the fan 30 is operating normally, the switching element 32 is turned on such that the output node n is connected to the ground GND1 through the switching element 32. Accordingly, the fault detection circuit 31 may output the detection signal fs of a low level V_L that is a ground signal.

For example, when a fault occurs in the fan 30, the switching element 32 is turned off, and thus the output node n is connected to the power source VCC1 through the resistor R. Accordingly, the fault detection circuit 31 may output the detection signal fs of a high level V_H. For example, the high level V_H may be higher than a ground voltage. Alternatively, the high level V_H may be lower than a ground voltage.

Here, the power source VCC1 may be the same as a power source for supplying an operating voltage (e.g., 24 V) to the fan 30.

Referring back to FIG. 1, the detection signal fs outputted from the fault detection circuit 31 of each fan 30 is transmitted to the module BMS 21 of the corresponding battery module 20.

Each module BMS 21 receives the detection signal fs from the fault detection circuit 31 of the corresponding fan 30 as described above, and it may transmit a state signal st corresponding to the detection signal fs to the module BMS 21 at a next stage or to the master BMS 10. In this process, when the other module BMS 21 is connected to a previous stage, each module BMS 21 combines the detection signal fs received from the corresponding fan 30 and the state signal st transferred from the previous module BMS 21, and it may transmit its own state signal st generated through the combination to the module BMS 21 at the next stage or to the master BMS 10.

As described above, the master BMS 10 receives the state signal st transmitted in combination with the detection signal fs of each fan 30 through the plurality of module BMS 21, and thus, it may determine fault occurrence of the plurality of fans 30. When a fault occurring in the plurality of fans 30 is detected, the master BMS 10 may notify that the fan fault has occurred to a higher system, or may output an output signal indicating the fan fault through various output devices.

Hereinafter, a fan fault detection device according to illustrative embodiments will be described in detail with reference to FIGS. 4, 5, 6, and 7.

Figure 4:
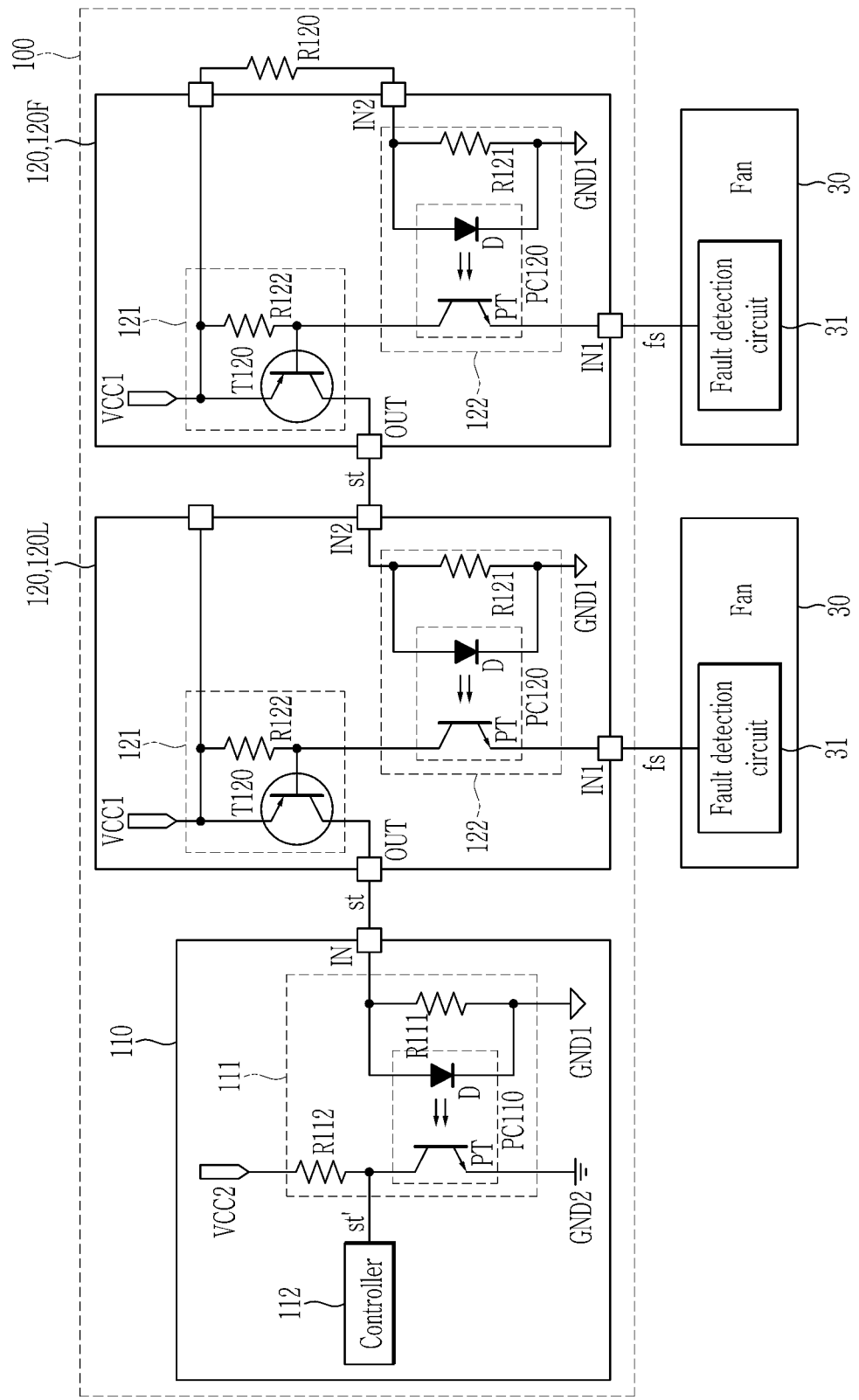
FIG. 4 is a circuit diagram of an illustrative embodiment of a fan fault detection device of the battery system of FIG. 1.

FIG. 4 is a circuit diagram of an illustrative embodiment of a fan fault detection device of the battery system of FIG. 1.

Referring to FIG. 4, a fan fault detection device 100 according to an illustrative embodiment may include a master module 110 and a plurality of sub-modules 120. In FIG. 4, the master module 110 may be mounted on the master BMS 10 of FIG. 1, and each sub-module 120 may be mounted on the module BMS 21 of FIG. 1. For example, FIG. 4 illustrates an example in which the fan fault detection device 100 includes two sub-modules 120, but illustrative embodiments are not limited thereto. For example, the number of sub-modules 120 included in the fan fault detection device 100 may be changed to correspond to the number of fans 30 installed in the battery system 1.

Each sub-module 120 may receive the detection signal fs from the fault detection circuit 31 of the corresponding fan 30, and may transmit the corresponding state signal st to the sub-module 120 at a next stage or to the master module 110. In this process, when the other sub-module 120 is connected to a previous stage, each sub-module 120 may combine the state signal st received from the previous sub-module 120 and the detection signal fs received from the fault detection circuit 31 of the corresponding fan 30, and may transmit the state signal st generated through the combination to the sub-module 120 at the next stage or to the master module 110.

For example, each sub-module 120 may include input terminals IN1 and IN2, an output terminal OUT, a switching circuit 121, and a signal transmission circuit 122.

The input terminal IN1 may receive the detection signal fs from the fault detection circuit 31 of the corresponding fan 30.

The input terminal IN2 may be connected to the output terminal OUT of the sub-module 120 at the previous stage, or may be connected to the first power source VCC1 through an end resistor R120. For example, when the other sub-module 120 is connected to the previous stage of the corresponding sub-module 120, the input terminal IN2 may be connected to the output terminal OUT of the previous sub-module 120 to receive the state signal st of the previous sub-module 120. For example, when the corresponding sub-module 120 is a sub-module 120F at the previous-most stage, the first power source VCC1 may be connected to the input terminal IN2 through the end resistor R120 to receive the state signal st from the first power source VCC1 instead of the previous sub-module. Here, the first power source VCC1 may be the same as a power source for supplying the operating voltage to the fan 30.

The switching circuit 121 may switch an output of the state signal st of the output terminal OUT according to the detection signal fs received from the corresponding fan 30 through the input terminal IN1. For example, the switching circuit 121 may be connected between the first power source VCC1 for supplying a voltage signal corresponding to the state signal st and the output terminal OUT, and when the detection signal fs received through the input terminal IN1 is transmitted through the signal transmission circuit 122, the switching circuit 121 may output the state signal st to the output terminal OUT according to a voltage level of the detection signal fs.

When the detection signal fs is a voltage level (for example, the low level V_L in FIG. 3) indicating a normal state of the corresponding fan 30, the switching circuit 121 may connect the first power source VCC1 and the output terminal OUT so that the voltage signal supplied from the first power source VCC1 is outputted as the state signal st through the output terminal OUT. In contrast, when the detection signal fs is a voltage level (for example, the high level V_H in FIG. 3) indicating a fault of the corresponding fan 30, the switching circuit 121 may cut off the connection between the first power source VCC1 and the output terminal OUT to block the output of the state signal st.

For example, the switching circuit 121 may be connected between the first power source VCC1 and the output terminal OUT, and may include a switching element T120 including a control terminal connected to the signal transmission circuit 122. Referring to FIG. 4 as an example, the switching element T120 may be a PNP transistor including an emitter connected to the first power source VCC1, a collector connected to the output terminal OUT, and a base for receiving the detection signal fs.

The switching circuit 121 may further include a resistor R122 for stable operation of the transistor T120. The resistor R122 may be connected between the emitter and the base of the transistor T120.

The signal transmission circuit 122 is connected between the input terminal IN1 and the switching circuit 121, and may transmit the detection signal fs received through the input terminal IN1 to the switching circuit 121 according to the signal received by the input terminal IN2. For example, when the state signal st is inputted from the previous sub-module 120 through the input terminal IN2, or when a voltage signal corresponding to the state signal st through the end resistor R120 (e.g., a voltage signal supplied by the first power source VCC1) is received, the signal transmission circuit 122 may transmit the detection signal fs received through the input terminal IN1 to the switching circuit 121. On the other hand, when the previous sub-module 120 blocks the output of the state signal st and thus the input terminal IN1 is in a floating state, the signal transmission circuit 122 may block the detection signal fs from being transmitted to the switching circuit 121.

For example, the signal transmission circuit 122 may include a photocoupler PC120 that includes a light emitting element D connected between the input terminal IN2 and the ground GND1 of the first power source, and a light receiving element PT connected between the input terminal IN1 and the switching circuit 121. Referring to FIG. 4, the photocoupler PC120 may be a photocoupler. For example, the photocoupler may include the light emitting diode D as a light emitting element and the phototransistor PT as a light receiving element. The light emitting diode D may include an anode connected to the input terminal IN2 and a cathode connected to the ground GND1. The phototransistor PT may include an emitter connected to the input terminal IN1 and a collector connected to the switching circuit 121. In the photocoupler PC120, when a voltage signal of a predetermined level is applied to the input terminal IN2, the light emitting element D emits light, and the light receiving element PT may be turned on by the light emitting of the light emitting element D to transmit the signal inputted to the input terminal IN1 to the switching circuit 121.

The signal transmission circuit 122 may stabilize a voltage between both terminals of the light emitting element D of the photocoupler PC120, and may additionally include a resistor R121 connected in parallel to both terminals of the light emitting element D for adjusting a current inputted to the light emitting element D of the photocoupler PC120.

According to the above, only when the state signal st is received from the previous sub-module 120 or the voltage signal corresponding to the state signal st is received, and only when the detection signal fs of the corresponding fan 30 corresponds to a normal state, each sub-module 120 may output the state signal st to a next stage through the output terminal OUT. Therefore, when a fault is detected even in one fan 30, the output of the state signal st is blocked by the corresponding sub-module 120, and only when all the fans 30 operate normally may the state signal st be transmitted to the master module 110 by a sub-module 120L positioned at the last-most stage.

In the master module 110, a controller 112, which determines whether the fan 30 has failed, has a different operating voltage from that of the sub-module 120. For example, the sub-module 120 operates at 24 V, which is the same as the operating voltage of the fan 30, but the controller 112 of the master module 110 may operate at an operating voltage of 3.3 V. Accordingly, the master module 110 may include a signal transmission circuit 111 for transmitting a state signal st inputted from the sub-module 120 to the controller 112 in an insulated state.

When the state signal st transmitted through the sub-module 120 is inputted to the input terminal IN of the master module 110 by the sub-module 120L at the last-most stage, the signal transmission circuit 111 may transmit a state signal st' corresponding thereto to an input terminal of the controller 112 in an insulated state.

The signal transmission circuit 111 may include a photo-coupler PC110 and a resistor R112. The photocoupler PC110 may include a light emitting element D connected between the input terminal IN of the master module 110 and the ground GND1 of the first power source VCC1 and a light receiving element PT connected between the input terminal of the controller 112 and the ground GND2 of the second power source VCC2. The resistor R112 may be connected between the input terminal of the controller 112 and the second power source VCC2. Here, the second power source VCC2 may be a power source for supplying an operating voltage of the controller 112.

Referring to FIG. 4, the photocoupler PC120 may be a photocoupler. For example, the photocoupler may include the light emitting diode D as a light emitting element and the phototransistor PT as a light receiving element. The light emitting diode D may include an anode connected to the input terminal IN and a cathode connected to the ground GND1. The phototransistor PT may include an emitter connected to the ground GND2 and a collector connected to the input terminal of the controller 112. When the state signal st is inputted to the input terminal IN, the light emitting element D of the photocoupler PC110 emits light, and thus the light emitting element PT is turned on, so that the input terminal of the controller 112 may be connected to the ground GND2. Thus, the controller 112 may determine that all the plurality of the fans 30 normally operate when the state signal st' as a low level state signal is inputted.

On the other hand, when the state signal st is not received by the input terminal IN (e.g., when the input terminal IN is in a floating state), the light emitting element D of the photocoupler PC110 is turned off, and thus the light receiving element PT is also turned off, so that the input terminal of the controller 112 is connected to the second power source VCC2 through the resistor R112. Thus, the controller 112 may determine that a fault has occurred in at least one of the fans 30 when the state signal st' is a high-level state signal.

In other words, when the state signal st is received from the sub-module 120, the signal transmission circuit 111 having the above-described structure may invert the state signal st such that the state signal st' as an inverting signal of the state signal st is transmitted to the controller 112. In other words, when the state signal st as a high-level state signal is inputted from the sub-module 120, the signal transmission circuit 111 connects the input terminal of the controller 112 to the ground GND2 such that the state signal st' as a low level state signal is inputted to the controller 112. On the other hand, when the output of the state signal st from the sub-module 120 is stopped or floating, the signal transmission circuit 111 connects the input terminal of the controller 112 to the second power source VCC2 through the resistor R112. However, since the signal transmission circuit 111 is not limited thereto, the signal transmission circuit 111 may be configured to transmit the state signal st inputted from the sub-module 120 in an insulated state to the controller 112 without inversion.

As described above, the controller 112 may receive the state signal st' in response to the state signal st inputted from the sub-module 120 through the signal transmission circuit 111, and based on the state signal st', it may determine occurrence of a fault in the plurality of fans 30. For example, the controller 112 may determine that a fault has occurred in at least one of the fans 30 when the state signal st' as a high-level state signal is received.

When a fault occurring in the plurality of fans 30 is detected, the controller 112 may notify that the fan fault has occurred to a higher system, or may output an output indicating the fan fault through various output devices.

Figure 5:
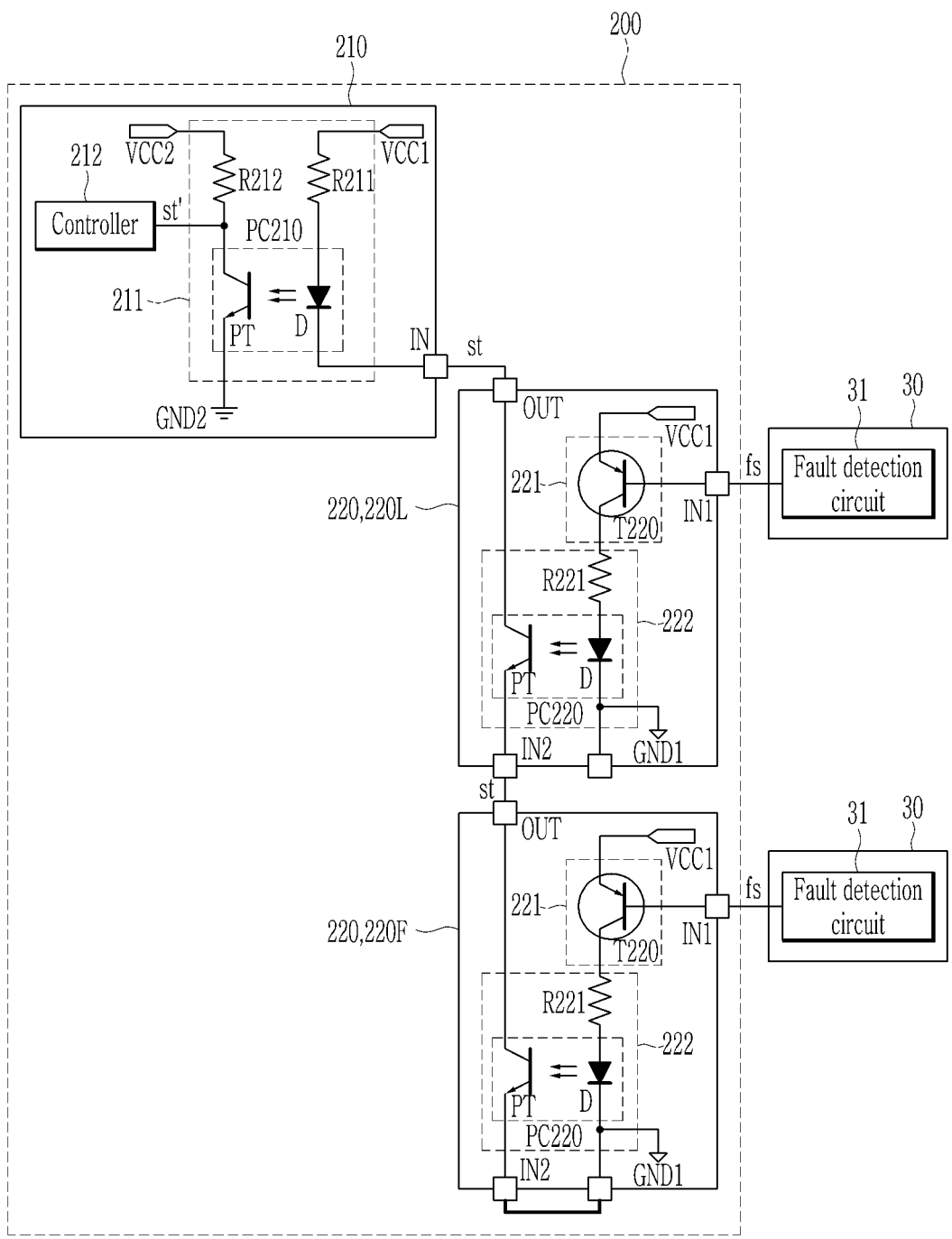
FIG. 5 is a circuit diagram of another illustrative embodiment of a fan fault detection device of the battery system of FIG. 1.

FIG. 5 is a circuit diagram of another illustrative embodiment of a fan fault detection device of the battery system of FIG. 1.

Referring to FIG. 5, a fan fault detection device 200 according to another illustrative embodiment may include a master module 210 and a plurality of sub-modules 220. In FIG. 5, the master module 210 may be mounted on the master BMS 10 of FIG. 1, and each sub-module 220 may be mounted on the module BMS 21 of FIG. 1. For example, FIG. 5 illustrates an example in which the fan fault detection device 200 includes two sub-modules 220, but illustrative embodiments are not limited thereto. For example, the number of sub-modules 220 included in the fan fault detection device 200 may be changed to correspond to the number of fans 30 installed in the battery system 1.

Each sub-module 220 may receive the detection signal fs from the fault detection circuit 31 of the corresponding fan 30, and may transmit the corresponding state signal st to the sub-module 220 at a next stage or to the master module 210. In this process, when the other sub-module 220 is connected to a previous stage, each sub-module 220 may combine the state signal st received from the previous sub-module 220 and the detection signal fs received from the fault detection circuit 31 of the corresponding fan 30, and may transmit the state signal st generated through the combination to the sub-module 220 at the next stage or to the master module 210.

For example, each sub-module 220 may include input terminals IN1 and IN2, an output terminal OUT, a switching circuit 221, and a signal transmission circuit 222.

The input terminal IN1 may receive the detection signal fs from the fault detection circuit 31 of the corresponding fan 30.

The input terminal IN2 may be connected to the output terminal OUT of the previous sub-module 220, or may be connected to the ground GND1 of the first power source VCC1. For example, when the other sub-module 220 is connected to the previous stage of the corresponding sub-module 220, the input terminal IN2 may be connected to the output terminal OUT of the previous sub-module 220 to receive the state signal st of the previous sub-module 220. On the other hand, when the corresponding sub-module 220 is a previous-most sub-module 220F, the input terminal IN2 may be connected to the ground GND2 to receive a ground signal as the state signal st. Here, the first power source VCC1 may be the same as a power source for supplying the operating voltage to the fan 30.

The switching circuit 221 may switch an output of the state signal st of the output terminal OUT according to the detection signal fs received from the corresponding fan 30 through the input terminal IN1. For example, the switching circuit 221 is connected between the first power source VCC1 and the light emitting element D of the signal transmission circuit 222, and switches the connection between the power source VCC1 and the signal transmission circuit 222 according to the voltage level of the detection signal fs received through the input terminal IN1, thereby switching the output of the state signal st of the signal transmission circuit 222.

When the detection signal fs is a voltage level (for example, the high level V_H in FIG. 3) indicating a fault of the corresponding fan 30, the switching circuit 221 may block the connection between the first power source VCC1 and the signal transmission circuit 222. On the other hand, when the detection signal fs is a voltage level (for example, the low level V_L in FIG. 3) indicating a normal state of the corresponding fan 30, the switching circuit 221 may connect the first power source VCC1 and the signal transmission circuit 222 so that the voltage signal supplied from the first power source VCC1 is transmitted to the signal transmission circuit 222.

For example, the switching circuit 221 may be connected between the first power source VCC1 and the signal transmission circuit 222, and may include a switching element T220 including a control terminal connected to the input terminal IN1. Referring to FIG. 5, the switching element T220 may be a PNP transistor. The PNP transistor may include an emitter connected to the first power source VCC1, a collector connected to the light emitting element D of the signal transmission circuit 222, and a base for receiving the detection signal fs.

The signal transmission circuit 222 is connected between the input terminal IN2 and the output terminal OUT, and may transmit the received state signal st to the input terminal IN2 to the output terminal OUT according to the signal inputted from the switching circuit 221. For example, when the voltage signal supplied from the first power source VCC1 is transmitted by the switching circuit 221, the signal transmission circuit 222 may transmit a signal received through the input terminal IN2 to the output terminal OUT so that the state signal st is outputted through the output terminal OUT. On the other hand, when the connection with the first power source VCC1 is blocked by the switching circuit 221, the signal transmission circuit 222 may block the connection between the input terminal IN2 and the output terminal OUT to block the output of the state signal st.

The signal transmission circuit 222 may include a photocoupler PC220 and a light receiving element PT. The photocoupler PC220 may include a light emitting element D connected between the switching circuit 221 and the ground GND1 of the first power source VCC1. The a light receiving element PT may be connected between the input terminal IN2 and the output terminal OUT. Referring to FIG. 5, the photocoupler PC220 may be a photocoupler. The photocoupler may include the light emitting diode D as a light emitting element and the phototransistor PT as a light receiving element. The light emitting diode D may include an anode connected to the first power source VCC1 through the switching circuit 221 and a cathode connected to the ground GND1. The phototransistor PT may include an emitter connected to the input terminal IN2 and a collector connected to the output terminal OUT. When the voltage signal of the first power source VCC1 is applied to the light emitting element D through the switching circuit 221, the photocoupler PC220 may transmit a signal inputted to the input terminal IN2 to the output terminal OUT as the light emitting element D emits light such that the light receiving element PT is turned on.

The signal transmission circuit 222 may further include a resistor R221 for controlling a current flowing to the light emitting element D of the photocoupler PC220. The resistor R221 may be connected between the anode of the light emitting element D and the switching element T220 of the switching circuit 221.

According to the above, when the detection signal fs received from the corresponding fan 30 indicates a normal state, the switching circuit 221 of each sub-module 220 transmits the voltage signal supplied from the first power source VCC1 to the signal transmission circuit 222, and the input terminal IN2 and the output terminal OUT are connected by the signal transmission circuit 222, so that the state signal st inputted from the sub-module 220 at a previous stage is transmitted to the sub-module 220 at a next stage. Here, the state signal st received from the previous sub-module 220 is a ground signal, and the sub-module 220 replaces the state signal st by connecting the input terminal IN2 to the ground GND2 when there is no sub-module 220 at a previous stage.

Therefore, when a fault is detected even in one fan 30, the transmission of the state signal st is blocked by the corresponding sub-module 220, and only when all the fans 30 operate normally, the state signal st may be transmitted to the master module 210 by a sub-module 220L positioned at the last-most stage.

In the master module 210, a controller 212, which determines whether the fan 30 has failed, has a different operating voltage from that of the sub-module 220. For example, the sub-module 220 operates at 24 V, which is the same as the operating voltage of the fan 30, but the controller 212 of the master module 210 may operate at an operating voltage of 3.3 V. Accordingly, the master module 210 may include a signal transmission circuit 211 for transmitting a state signal st inputted from the sub-module 220 to the controller 212 in an insulated state.

When the state signal st transmitted through the sub-module 220 is inputted to the input terminal IN of the master module 210 by the sub-module 220L at the last-most stage, the signal transmission circuit 211 may transmit the state signal st' corresponding thereto to an input terminal of the controller 212 in an insulated state.

The signal transmission circuit 211 may include: a photocoupler PC210 and a resistor R212. The photocoupler PC210 may include a light emitting element D connected between the input terminal IN of the master module 210 and the first power source VCC1, and a light receiving element PT connected between the input terminal of the controller 212 and the ground GND2 of the second power source VCC2. The resistor R212 may be connected between the input terminal of the controller 212 and the second power source VCC2. Here, the second power source VCC2 may be a power source for supplying an operating voltage of the controller 212.

Referring to FIG. 5, the photocoupler PC210 may be a photocoupler. The photocoupler may include: the light emitting diode D as a light emitting element and the phototransistor PT as a light receiving element. The light emitting diode D may include an anode connected to the first power source VCC1 and a cathode connected to the input terminal IN. The phototransistor PT may include an emitter connected to the ground GND2 and a collector connected to the input terminal of the controller 112. According to this illustrative embodiment, the state signal st transmitted from the sub-module 220 to the master module 210 is the ground signal supplied from the ground GND1. Therefore, in the photocoupler PC210, when the state signal st is inputted to the input terminal IN (e.g., when the input terminal IN is connected to the ground GND1 through the sub-modules 220), the light emitting element D emits light, and the light receiving element PT is turned on by the light emission of the light emitting element D, so that the input terminal of the controller 212 may be connected to the ground GND2. On the other hand, when the state signal st is not received by the input terminal IN (e.g., when the input terminal IN is in a floating state), the light emitting element D is turned off, and thus the light receiving element PT is also turned off, so that the input terminal of the controller 212 is connected to the second power source VCC2 through the resistor R212.

The signal transmission circuit 211 may further include a resistor R211 for controlling a current flowing to the light emitting element D of the photocoupler PC210. The resistor R211 may be connected between the anode of the light emitting element D and the first power source VCC1.

When the state signal st of a low level (e.g., the state signal st as the ground signal is inputted from the sub-module 220), the signal transmission circuit 211 having the above-described structure connects the input terminal of the controller 112 to the ground GND2 such that a state signal st' with a low level is inputted to the input terminal of the controller 112. Thus, the controller 212 may determine that all the plurality of the fans 30 normally operate when the state signal st' as a low level state signal is inputted.

On the other hand, when the transmission of the state signal st from the sub-module 220 is blocked, the signal transmission circuit 211 connects the input terminal of the controller 212 to the second power source VCC2 through the resistor R212 such that the state signal st' with a high level is inputted to the input terminal of the controller 212. Thus, the controller 212 may determine that a fault has occurred in at least one of the fans 30 when the state signal st' is a high level state signal. However, since the signal transmission circuit 111 is not limited thereto, the signal transmission circuit 211 may be configured to invert the state signal st inputted from the sub-module 220 in an insulated state to transmit it to the controller 212.

As described above, the controller 212 may receive the state signal st' in response to the state signal st inputted from the sub-module 220 through the signal transmission circuit 211, and based on the state signal st', it may determine occurrence of a fault in the plurality of fans 30. For example, the controller 212 may determine that a fault has occurred in at least one of the fans 30 when the state signal st' as a high level state signal is inputted.

When a fault occurring in the plurality of fans 30 is detected, the controller 212 may notify that the fan fault has occurred to a higher system, or may output an output indicating the fan fault through various output devices.

Figure 6:
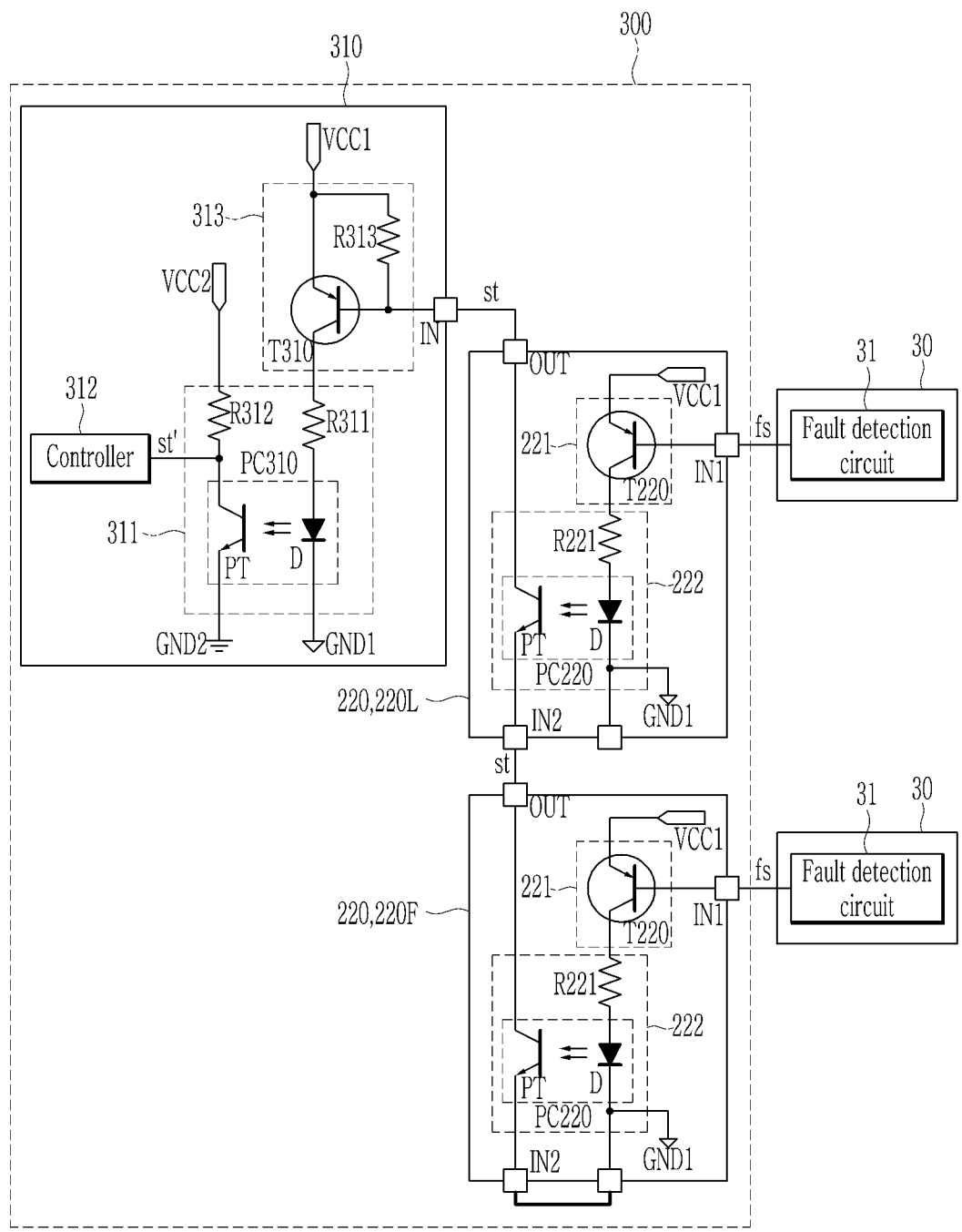
FIG. 6 is a circuit diagram of another illustrative embodiment of a fan fault detection device of the battery system of FIG. 1.

FIG. 6 is a circuit diagram of another illustrative embodiment of a fan fault detection device of the battery system of FIG. 1, and it has a structure in which a filter circuit 313 is added to the master module of the fan fault detection device 200 of FIG. 5.

Referring to FIG. 6, since a fan fault detection device 300 according to another illustrative embodiment includes the same one as the sub-module 220 of the fan fault detection device 200 described with reference to FIG. 5, an operational description of the sub-module 220 will be omitted for descriptive convenience.

Referring to FIG. 6, a master module 310 of the fan fault detection device 300 may include a signal transmission circuit 311, a controller 312, and the filter circuit 313.

The filter circuit 313 is for a stable operation of the signal transmission circuit 311 regardless of noise generated while the state signal st is transmitted through the sub-modules 220. For example, when the state signal st is inputted, the filter circuit 313 may filter the state signal st to transmit it to the signal transmission circuit 311. For example, the filter circuit 313 is connected to the input terminal IN of the master module 310, and may switch the connection between the light emitting element D of the signal transmission circuit 311 and the first power source VCC1 according to the state signal st transmitted from the sub-module 220 through the input terminal IN. For example, when the state signal st is inputted from the sub-module 220, the filter circuit 313 may transmit the first power source VCC1 to the signal transmission circuit 311 such that the signal corresponding to the inputted state signal st is transmitted to the controller 312 through the signal transmission circuit 311. On the other hand, when the state signal st is blocked and thus the input terminal IN is floating, the filter circuit 313 may block the voltage signal of the first power source VCC1 from being applied to the signal transmission circuit 311, thereby deactivating the signal transmission circuit 311.

For example, the filter circuit 313 may include a PNP transistor including an emitter connected to the first power source VCC1, a collector connected to the light emitting element D of the signal transmission circuit 311, and a base connected to the input terminal IN.

When the state signal st transmitted through the sub-module 220 is inputted to the input terminal IN of the master module 210 by the sub-module 220L at the last-most stage, the signal transmission circuit 311 may transmit the state signal st' corresponding thereto to an input terminal of the controller 312 in an insulated state.

The signal transmission circuit 311 may include: a photocoupler PC310 and a resistor R312. The photocoupler PC310 may include a light emitting element D connected between the first power source VCC1 and the ground GND1 and a light receiving element PT connected between the input terminal of the controller 312 and the ground GND2 of the second power source VCC2. The resistor R312 connected between the input terminal of the controller 312 and the second power source VCC2. Here, the second power source VCC2 may be a power source for supplying an operating voltage of the controller 312.

Referring to FIG. 6, the photocoupler PC320 may be a photocoupler. The photocoupler may include: the light emitting diode D as a light emitting element and the phototransistor PT as a light receiving element. For example, the light emitting diode D may include an anode connected to the first power source VCC1 through the filter circuit 313 and a cathode connected to the ground GND1. The phototransistor PT may include an emitter connected to the ground GND2 and a collector connected to the input terminal of the controller 312. In the photocoupler PC310, when the low level state signal st is inputted through the input terminal IN, the first power source VCC1 is connected to the anode of the light emitting element D through the filter circuit 313, and thus the light emitting element D emits light, and the light receiving element PT may be turned on by light emission of the light emitting element D such that the input terminal of the controller 312 is connected to the ground GND2. Thus, the controller 312 may determine that all the plurality of the fans 30 normally operate when the state signal st' as a low level state signal is inputted.

On the other hand, when the state signal st is not received by the input terminal IN (e.g., when the input terminal IN is in a floating state), the connection to the first power source VCC1 is blocked by the filter circuit 313 such that the light emitting element D is turned off, and thus the light receiving element PT is also turned off, so that the input terminal of the controller 312 is connected to the second power source VCC2 through the resistor R312. Thus, the controller 312 may determine that a fault has occurred in at least one of the fans 30 when the state signal st' is a high level state signal.

The signal transmission circuit 311 may further include a resistor R311 for controlling a current flowing to the light emitting element D of the photocoupler PC310. The resistor R311 may be connected between the anode of the light emitting element D and the first power source VCC1.

When the state signal st of a low level is inputted from the sub-module 220, the signal transmission circuit 311 having the above-described structure connects the input terminal of the controller 312 to the ground GND2 such that a state signal st' of a low level is inputted. On the other hand, when the transmission of the state signal st from the sub-module 220 is blocked, the signal transmission circuit 311 connects the input terminal of the controller 312 to the second power source VCC2 through the resistor R312 such that a signal of a high level is inputted. However, since the signal transmission circuit 311 is not limited thereto, the signal transmission circuit 311 may be configured to invert the state signal st inputted from the sub-module 220 in an insulated state to transmit it to the controller 312.

As described above, the controller 312 may receive the state signal st' in response to the state signal st inputted from the sub-module 220 through the signal transmission circuit 311, and based on the state signal st', it may determine occurrence of a fault in the plurality of fans 30. For example, the controller 312 may determine that all the plurality of the fans 30 normally operate when the state signal st' as a low level state signal is inputted.

When a fault occurring in the plurality of fans 30 is detected, the controller 212 may notify that the fan fault has occurred to a higher system, or may output an output indicating the fan fault through various output devices.

The fan fault detection device 300 of FIG. 6 may improve detection reliability by adding the filter circuit 313 to the fan fault detection device 200 described with reference to FIG. 5.

Figure 7:
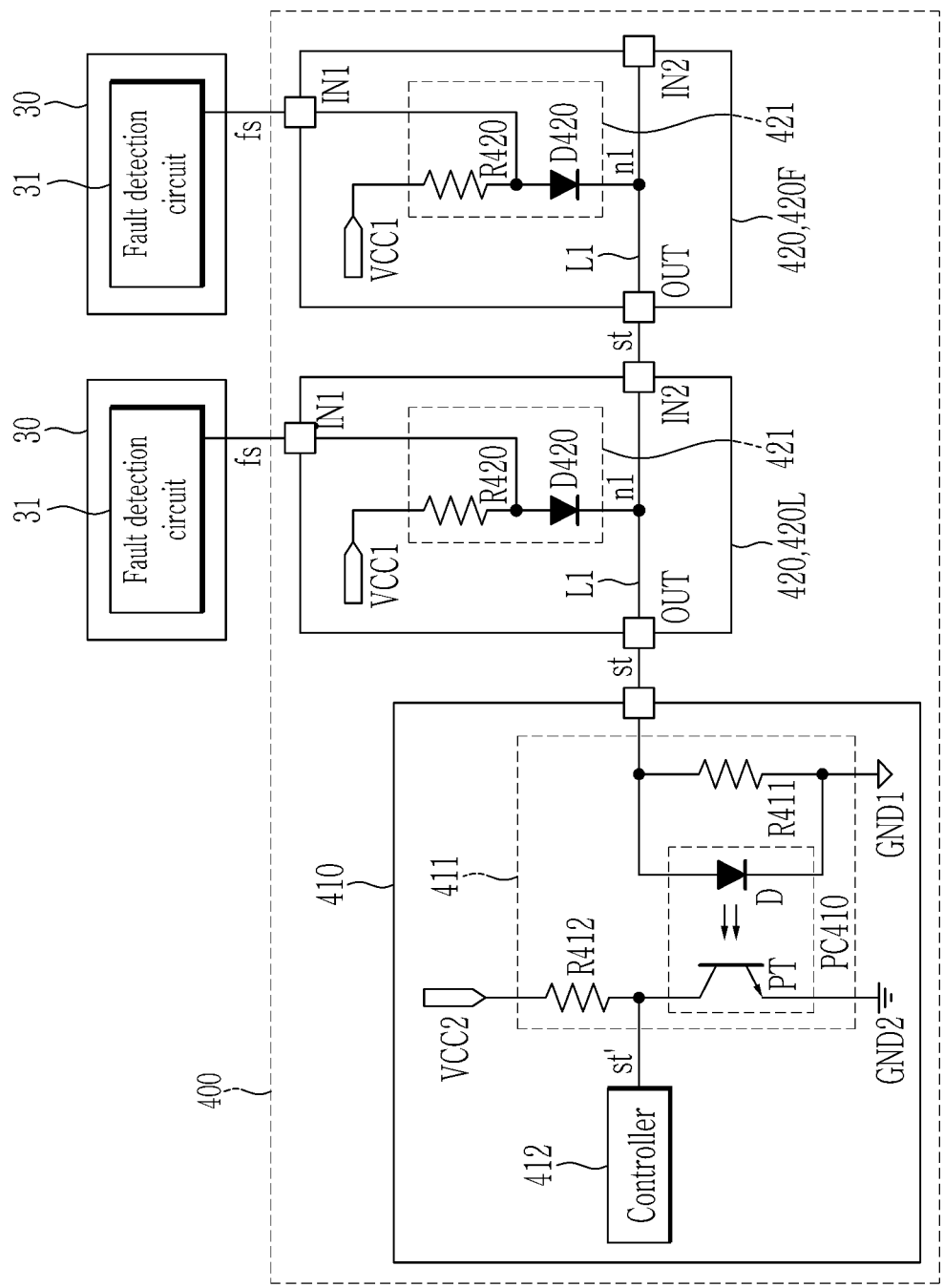
FIG. 7 is a circuit diagram of another illustrative embodiment of a fan fault detection device of the battery system of FIG. 1.

FIG. 7 is a circuit diagram of an illustrative embodiment of a fan fault detection device of the battery system of FIG. 1.

Referring to FIG. 7, a fan fault detection device 400 according to another illustrative embodiment may include a master module 410 and a plurality of sub-modules 420. In FIG. 7, the master module 410 may be mounted on the master BMS 10 of FIG. 1, and each sub-module 420 may be mounted on the module BMS 21 or the fan 30 of FIG. 1. For example, FIG. 7 illustrates an example in which the fan fault detection device 400 includes two sub-modules 420, but illustrative embodiments are not limited thereto. For example, the number of sub-modules 420 included in the fan fault detection device 400 may be changed to correspond to the number of fans 30 installed in the battery system 1.

Each sub-module 420 may receive the detection signal fs from the fault detection circuit 31 of the corresponding fan 30, and may transmit the corresponding state signal st to the sub-module 420 at a next stage or to the master module 410. In this process, when the other sub-module 420 is connected to a previous stage, each sub-module 420 may combine the state signal st received from the previous sub-module 420 and the detection signal fs received from the fault detection circuit 31 of the corresponding fan 30, and may transmit the state signal st generated through the combination to the sub-module 420 at the next stage or to the master module 410.

For example, each sub-module 420 may include input terminals IN1 and IN2, an output terminal OUT, and a signal transmission circuit 421.

The input terminal IN1 may receive the detection signal fs from the fault detection circuit 31 of the corresponding fan 30.

The input terminal IN2 may be connected to the output terminal OUT of the sub-module 420 at a previous stage, or may be floated. For example, when the other sub-module 420 is connected to the previous stage of the corresponding sub-module 420, the input terminal IN2 may be connected to the output terminal OUT of the previous sub-module 420 to receive the state signal st of the previous sub-module 420. On the other hand, when the corresponding sub-module 420 is a sub-module 420F at the previous-most stage, the input terminal IN2 may be floating.

The signal transmission circuit 421 is connected between the input terminal IN1 and a coupling node n1, and may transmit the detection signal fs to the coupling node n1 according to the detection signal fs received through the input terminal IN1. For example, when a voltage level of the detection signal fs is a voltage level indicating a fault of the corresponding fan 30 (for example, the high level V_H in FIG. 3), the signal transmission circuit 421 may transmit the detection signal fs to the coupling node n1. On the other hand, when the voltage level of the detection signal fs is a voltage level indicating a normal state of the corresponding fan 30 (for example, the low level V_L in FIG. 3), the signal transmission circuit 421 may block the the detection signal fs from being transmitted to the coupling node n1.

For example, the signal transmission circuit 421 may include a resistor R420 connected between the input terminal IN1 and the first power source VCC1, and a diode D420 having an anode connected to the input terminal IN1 and a cathode connected to the coupling node n1.

The coupling node n1 is a node positioned on a signal transmission line L1 between the input terminal IN2 and the output terminal OUT, and the detection signal fs transmitted to the coupling node n1 by the signal transmission circuit 421 be combined with a signal received through the input terminal IN2 at the coupling node n1 to be output as the state signal st through the output node OUT.

As described above, when the detection signal fs of the corresponding fan 30 indicates a fault state, each sub-module 420 transmits the detection signal fs, which a high level voltage signal, to the coupling node n1, and the coupling nodes n1 of the sub-modules 420 are connected to each other through the signal transmission line L1. Accordingly, when any one fan fails, the detection signal fs is outputted to the coupling node n1 of the corresponding sub-module 420, and it may be transmitted as the state signal st through the sub-module 420 at a next stage to be inputted to the master module 410. On the other hand, when all the fans 30 are in a normal state, all the coupling nodes n1 are in a floating state, and thus the input terminal IN of the master module 410 may also be in a floating state in which the state signal st is not inputted.

The master module 410 may include a signal transmission circuit 411 for transmitting the state signal st inputted from the sub-module 120 to a controller 412 in an insulated state through the input terminal IN.

When the state signal st transmitted through the sub-module 420 is inputted to the input terminal IN of the master module 410 by a sub-module 420L at the last-most stage, the signal transmission circuit 411 may transmit the state signal st' corresponding thereto to an input terminal of the controller 412 in an insulated state.

The signal transmission circuit 411 may include a photocoupler PC410 and a resistor R412. The photocoupler PC410 may include a light emitting element D connected between the input terminal IN of the master module 410 and the ground GND1 of the first power source VCC1 and a light receiving element PT connected between the input terminal of the controller 412 and the ground GND2 of the second power source VCC2. The resistor R412 may be connected between the input terminal of the controller 412 and the second power source VCC2. Here, the second power source VCC2 may be a power source for supplying an operating voltage of the controller 412.

Referring to FIG. 7, the photocoupler PC410 may be a photocoupler. The photocoupler may include: the light emitting diode D as a light emitting element and the phototransistor PT as a light receiving element. The light emitting diode D may include an anode connected to the input terminal IN and a cathode connected to the ground GND1. The phototransistor PT may include an emitter connected to the ground GND2 and a collector connected to the input terminal of the controller 112.

When a fault is detected in one or more of the fans 30 such that the state signal st corresponding to the high level detection signal fs is input to the input terminal IN, the light emitting element D of the photocoupler PC410 of the signal transmission circuit 411 connected between the input terminal IN and the ground GND1 emits light, and thus the light receiving element PT is turned on, so that the input terminal may be connected to the ground GND2. Thus, the controller 412 may determine that a fault has occurred in at least one of the fans 30 when the state signal st' is a low level state signal.

On the other hand, when all the fans 30 normally operate and thus the input terminal IN is in a floating state, the light emitting element D of the photocoupler PC410 is turned off, and thus the light receiving element PT is also turned off, so that the input terminal of the controller 412 is connected to the second power source VCC2 through the resistor R412. Thus, the controller 412 may determine that all the plurality of the fans 30 normally operate when the state signal st' as a high level state signal is inputted.

When the state signal st is inputted from the sub-module 120, the signal transmission circuit 411 having the above-described structure may invert the state signal st such that the state signal st' as an inverting signal of the state signal st is transmitted to the controller 412. In other words, when the state signal st as a high level state signal is inputted from the sub-module 420, the signal transmission circuit 411 connects the input terminal of the controller 412 to the ground GND2 such that the state signal st' as a low level state signal is inputted. On the other hand, when the output of the state signal st from the sub-module 420 is stopped or floating, the signal transmission circuit 411 connects the input terminal of the controller 412 to the second power source VCC2 through the resistor R412. However, since the signal transmission circuit 411 is not limited thereto, the signal transmission circuit 411 may be configured to transmit the state signal st inputted from the sub-module 420 in an insulated state to the controller 412 without inversion.

As described above, the controller 412 may receive the state signal st' in response to the state signal st inputted from the sub-module 420 through the signal transmission circuit 411, and based on the state signal st', it may determine occurrence of a fault in the plurality of fans 30. For example, the controller 412 may determine that a fault has occurred in at least one of the fans 30 when the state signal st' as a low level state signal is received.

When a fault occurring in the plurality of fans 30 is detected, the controller 412 may notify that the fan fault has occurred to a higher system, or may output an output indicating the fan fault through various output devices.

Unlike the fan fault detection devices 100, 200, and 300 described with reference to FIG. 4, 5, and FIG. 6, the fan fault detection device 400 of FIG. 7 may be implemented with only a simple circuit without the need for the sub-module 420 to have a photocoupler. Therefore, it requires a small installation space and has a low manufacturing cost.

It is required that only an insulation distance is secured by completely separating a fan power source and a fan fault signal from a hazard part, there is no burden regarding a circuit configuration such as a photocoupler specification for signal transmission, and a circuit may be configured with components that are readily available without being affected by a battery system voltage.

As described above, the fan fault detection device according to the illustrative embodiments operates while being completely separated from the high voltage side in the battery system. Therefore, parts used for signal transmission may be easily selected and supplied, and a manufacturing cost thereof may be low.

Although certain illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A fan fault detection device comprising:
    a plurality of sub-modules connected to a plurality of fans; and
    a master module connected to at least one of the plurality of sub-modules and configured to determine faults of the plurality of fans,
    wherein each sub-module of the plurality of sub-modules comprises:
        a first input terminal for receiving a detection signal from a corresponding fan of the plurality of fans indicating whether the corresponding fan is defective;
        a second input terminal;
        an output terminal;
        a switching circuit connected between the output terminal and a first power source of the sub-module, and configured to supply a voltage signal corresponding to a state signal and to switch an output of the state signal through the output terminal according to the detection signal; and
        a first signal transmission circuit connected between the first input terminal and the switching circuit, the first signal transmission circuit being configured to transmit the detection signal to the switching circuit according to a signal received by the second input terminal from an output terminal of another one of the plurality of sub-modules,
    wherein:
        in a first sub-module of the plurality of sub-modules, a second input terminal thereof is connected to the first power source, and
        in a second sub-module of the plurality of sub-modules, an output terminal thereof is connected to the master module, and a second input terminal thereof is connected to an output terminal of the first sub-module.

2. The fan fault detection device of claim 1, wherein the switching circuit comprises:
a switching element connected between the first power source and the output terminal of each of the plurality of sub-modules, the switching element comprising a control terminal connected to the first input terminal through the first signal transmission circuit; and
a resistor connected between the first power source and the control terminal of the switching element.

3. The fan fault detection device of claim 2, wherein the switching element of the switching circuit is configured to be turned on when the detection signal indicates a normal state of the corresponding fan.

4. The fan fault detection device of claim 3, wherein the switching element of the switching circuit is a PNP transistor comprising an emitter connected to the first power source and a collector connected to the output terminal.

5. The fan fault detection device of claim 1, wherein the first signal transmission circuit comprises a photocoupler comprising:
a light emitting element connected between the second input terminal and a first ground of the sub-module; and
a light receiving element connected between the switching circuit and the first input terminal.

6. The fan fault detection device of claim 1, wherein the master module comprises:
an input terminal connected to the output terminal of the second sub-module;
a controller configured to determine whether at least one of the plurality of fans is defective; and
a second signal transmission circuit configured to transmit a signal received through the input terminal of the master module in an insulated state to an input terminal of the controller.

7. The fan fault detection device of claim 6, wherein:
the second signal transmission circuit comprises:
a resistor connected between a second power source and the input terminal of the controller; and
a photocoupler; and
the photocoupler comprises:
a light emitting element connected between the input terminal and a first ground of the sub-module; and
a light receiving element connected between the input terminal of the controller and a second ground of the second power source.

8. The fan fault detection device of claim 1, wherein the first power source is a power source for supplying an operating voltage to the plurality of fans.

9. The fan fault detection device of claim 1, wherein the plurality of sub-modules are mounted on each of a plurality of battery management systems mounted for each of a plurality of battery modules in a battery system.

10. A fan fault detection device comprising:
a plurality of sub-modules connected to a plurality of fans; and
a master module connected to at least one of the plurality of sub-modules and configured to determine faults of the plurality of fans,
wherein each sub-module of the plurality of sub-modules comprises:
a first input terminal for receiving a detection signal from a corresponding fan of the plurality of fans indicating whether the corresponding fan is defective;
a second input terminal receiving a state signal;
an output terminal; and
a first signal transmission circuit connected between the first input terminal and a coupling node on a signal transmission line connecting the second input terminal and the output terminal to each other, the first signal transmission circuit being configured to control transmission of the detection signal between the first input terminal and the coupling node according to the detection signal,
wherein:
in a first sub-module of the plurality of sub-modules, a second input terminal thereof is floating, and
in a second sub-module of the plurality of sub-modules, an output terminal thereof is connected to the master module, and a second input terminal thereof is connected to an output terminal of the first sub-module.

11. The fan fault detection device of claim 10, wherein the first signal transmission circuit comprises:
a resistor connected between the first input terminal and a first power source of the sub-module; and
a diode comprising an anode connected to the first input terminal and a cathode connected to the coupling node.

12. The fan fault detection device of claim 10, wherein the master module comprises:
an input terminal connected to the output terminal of the second sub-module;
a controller configured to determine whether at least one of the plurality of fans is defective; and
a second signal transmission circuit configured to transmit a signal received through the input terminal of the master module in an insulated state to an input of the controller.

13. The fan fault detection device of claim 12, wherein:
the second signal transmission circuit comprises:
a resistor connected between a second power source of the master module and the input of the controller; and
a photocoupler comprising:
a light emitting element connected between the input terminal of the master module and a first ground of the master module; and
a light receiving element connected between the input terminal of the controller and a second ground of the master module.

* * * * *